United States Patent [19]

Linder

[11] Patent Number: 4,768,019
[45] Date of Patent: Aug. 30, 1988

[54] ANALOG-TO-DIGITAL CONVERTER

[75] Inventor: William J. Linder, Hennepin, Minn.

[73] Assignee: Honeywell Inc., Minneapolis, Minn.

[21] Appl. No.: 101,109

[22] Filed: Sep. 25, 1987

[51] Int. Cl.⁴ .............................. H03M 1/50
[52] U.S. Cl. ............... 340/347 NT; 340/347 AD
[58] Field of Search .............. 340/347 AD, 347 NT

[56] References Cited

U.S. PATENT DOCUMENTS

| Re. 28,706 | 2/1976 | Dorey | 340/347 NT |
|---|---|---|---|
| 3,737,892 | 6/1973 | Dorey | 340/347 NT |
| 3,859,654 | 1/1975 | Harrison et al. | 340/347 AD |
| 3,883,864 | 5/1975 | Thomas | 340/347 AD |
| 3,930,252 | 12/1975 | Storar | 340/347 NT |
| 3,943,506 | 3/1976 | Peattie | 340/347 NT |
| 4,110,747 | 8/1978 | LaBrie | 340/347 NT |
| 4,143,361 | 3/1979 | Tammes et al. | 340/347 CC |
| 4,210,903 | 7/1980 | LaBrie | 340/347 NT |
| 4,243,975 | 1/1981 | Masuda et al. | 340/347 NT |
| 4,337,456 | 6/1982 | Deffendall et al. | 340/347 NT |
| 4,354,176 | 10/1982 | Aihara | 340/347 NT |
| 4,431,987 | 2/1984 | Whiteside | 340/347 DA |
| 4,445,111 | 4/1984 | Swift et al. | 340/347 CC |
| 4,484,177 | 11/1984 | Jobbagy | 340/347 NT |
| 4,567,465 | 1/1986 | Komiya | 340/347 AD |
| 4,596,977 | 6/1986 | Bauman et al. | 340/347 NT |

Primary Examiner—William M. Shoop, Jr.
Assistant Examiner—Richard K. Blum
Attorney, Agent, or Firm—William T. Udseth

[57] ABSTRACT

An integrating analog-to-digital converter having an operational amplifier serving as an integrator and as a comparator.

36 Claims, 5 Drawing Sheets

ANALOG-TO-DIGITAL CONVERTER

BACKGROUND OF THE INVENTION

1. Field of the Invention.

The present invention relates to analog-to-digital converters and, more particularly, to integrating analog-to-digital converters.

Analog-to-digital converters are used to provide sequences of digital code representations of numbers in any chosen number base where each of such numbers corresponds to a point in an analog input signal waveform provided with respect to a reference value. In other words, the digital code representations of a sequence of numbers is related to the magnitudes of a corresponding sequence of points in such an analog signal and to the fixed magnitude of a reference level.

These analog-to-digital converters compare the magnitude taken by the analog input signal at a point in time to the reference level magnitude and attempt to provide an approximation of this relationship, as it occurs in the short sampling time interval, by a digital code representation. This process is repeated to give a sequence of digital code representations corresponding to sample points in the analog waveform. The conversion process may be expressed by the analog input signal magnitude being taken equal to the product of the reference level, the output "estimating number" that is represented by the digital code representation, and a "transfer function parameter" which is just equal to one for linear converters. However, several possibilities in the converter can permit variances to occur resulting in a conversion process so as to result in a nonlinear converter if the design of the converter is not carefully managed.

Another source of difficulty in the conversion process is the presence of noise on the analog input signal to be converted to a sequence of digital code representations. Since the conversion process, as previously described, provides a digital code representation for each corresponding point in the analog input signal which depends on the value of that signal at the exact point in time when the sample is taken, the output code sequence will differ from what it otherwise would have been in the presence of noise in the analog signal. Although such noise could be removed to a considerable extent by subsequent digital processing, there can be substantial value in eliminating any effect of the noise before the conversion is complete. Typically, this is done by using an analog-to-digital conversion technique in which the digital code representation depends on the time integral or average value of the analog input signal during some time interval at each point where a conversion is desired. Such integration or averaging of the signal sample leads to being able to give very repeatable results for the same analog waveform even in the presence of substantial amounts of noise occurring in connection with that signal. The effects of noise will be averaged out for those noise frequencies present within the analog input signal which have the reciprocal values thereof that are less than the time of the integration of the analog input signal about a sampling point.

Such analog-to-digital converters can be most conveniently and cheaply provided in monolithic integrated circuit chips. However, there is a strong need to minimize the amount of surface area in the major surface of the monolithic integrated circuit chip which must be devoted to implementing such analog-to-digital converters. This is especially true where multiple analog-to-digital converters are provided in one chip to accommodate multiple analog input signals. Often, integration of each of the analog signals must be done simultaneously with the others during the sampling thereof to eliminate unwanted timing differences which could otherwise arise in the conversion of these signals to their respective digital code sequences. Thus, an analog-to-digital converter is desired which integrates an analog signal at its input for a period of time as part of the conversion process and which can be implemented with taking up relatively little space at the surface of the monolithic integrated circuit chip.

SUMMARY OF THE INVENTION

The present invention provides an analog-to-digital converter having an operational amplifier which first serves as an integrator and then is switched to serve as a comparator in each conversion cycle, the amplifier output being connected to operate a memory to receive counts from a counter also used to control a staircase signal generator provided as a comparison signal source. Such a counter and staircase signal generator can be used together in a multiple conversion channel system having a plurality of operational amplifiers where each is associated with one of the channels to receive and convert a separate analog signal input. The integration time for this assemblage of analog-to-digital converters can be controlled on the basis of which of the operational amplifiers, one being present in each converter, has an output signal first reaching magnitude limit during integration. Alternatively, the integration time can be controlled on the basis of the average of all of these operational amplifiers reaching a magnitude limit.

DETAILED DESCRIPTION OF THE PREFERRED EMBODIMENTS

Figure 1:
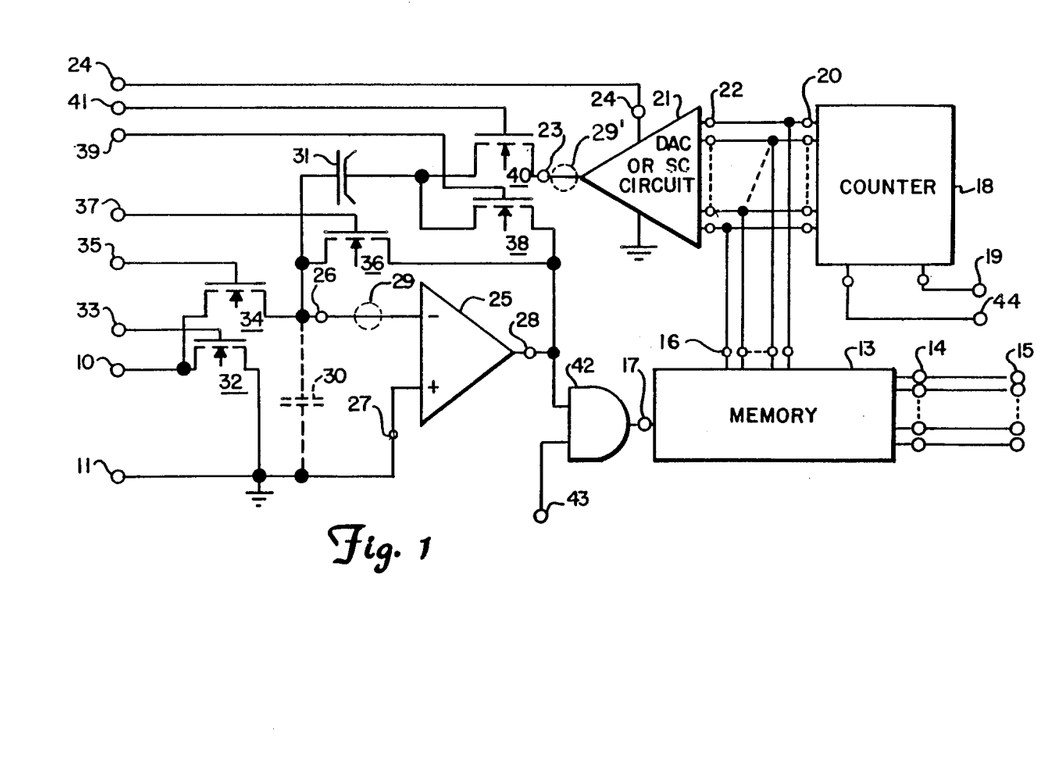
FIG. 1 shows an embodiment of the present invention.

FIG. 1 shows a system diagram of the analog-to-digital converter of the present invention. An analog input signal in the form of a current is assumed to be provided between a system analog signal input, 10, and a further terminal, 11, at which the system ground reference voltage is provided. For purposes of this discussion, the direction of the signal current will be taken as being drawn out of terminal 10 and supplied into terminal 11. Alternatively, a voltage signal can be converted by placing a resistor in series with the voltage source before connecting this series combination between terminals 10 and 11 of FIG. 1.

The analog-to-digital converter output digital representation codes will be provided as a plurality of digit signals, each representing a digit or code symbol place in the code, by a memory register, 13, at its outputs, 14.

Outputs 14 are connected to the analog-to-digital converter system outputs, 15.

Digital code sequences in each conversion cycle are provided by a code generating means, 18, to memory register 13 at its inputs, 16, for storage therein upon occurrence of a high logic stage voltage level at its WRITE control signal input, 17. Code generating means, 18, is formed here by a counter system means. Counter means 18 has a clock input, 19, at which a repeated pulse clocking signal causes counter 18 to provide count sequences at its outputs, 20, there being a new count output for each clock pulse. Typically, these count sequences may be successive counts in the binary number system, but any other digital coding arrangement for such counts which may be desired could be generated by an appropriate design for counter means 18.

The count sequences provided at outputs 20 of counter means 18 are also provided to a staircase signal generator, 21, at its inputs, 22. The count sequences of counter means 18 in each conversion cycle cause staircase signal generator 21 to provide a series of differing magnitude voltage levels in each conversion cycle at its output, 23, one level for each count received. The voltage levels start from a reference voltage, $V_R$, provided to the reference voltage input, 24, for the system of FIG. 1 and then decreasing in magnitude for each successive count. Reference input 24 is shown extended to the left in FIG. 1. This series of voltage levels is used to determine the integrated value found for the input analog signal during a sampling for a conversion cycle. The digital code in the count sequence from counter means 18 which corresponds to that voltage level from staircase signal generator 21 which "matches" the signal integration result value is then the digital code representation for that value which is stored in memory register 13 and provided at system outputs 15 for that conversion.

Integration of a sample of the analog input signal for a conversion, the result of which is to be compared with the various voltage levels generated at output 23 of staircase signal generator 21, is accomplished through the use of an operational amplifier, 25. Operational amplifier 25 is an amplifier having a relatively high circuit impedance to ground at both its inverting input, 26, and its non-inverting input, 27, and between each other, as compared to the circuit impedance to ground at its output, 28. Operational amplifier 25 has a substantial gain at output 28 for signals appearing at either of inputs 26 or 27, the gain being negative, of course, for signals appearing at inverting input 26.

In addition, amplifier 25 will be subject to internal offset errors. If, as is assumed here, operational amplifier 25 is formed of metal-oxide-semiconductor field-effect transistors (MOSFET's) in an implementation in a monolithic integrated circuit chip, the input currents will be so extremely small that any offset differences between them can be ignored. On the other hand, a significant offset voltage will appear between inputs 26 and 27 of operational amplifier 25. This offset voltage is represented in FIG. 1 by a voltage source drawn in the form of a dashed line circle, 29, in FIG. 1. This voltage source is assumed to have a polarity such that its negative side is connected toward the body of amplifier 25 in FIG. 1, and its positive side is connected toward input terminal 26 of amplifier 25. Also, there will alternatively be an internal offset voltage present at output 23 of staircase signal generator 21 earlier described. This has been represented by a dashed circle generator, 29', with its negative side assumed connected toward the body of generator 21 and its positive side connected to output terminal 23.

In addition, parasitic capacitances will occur from inverting input 26 to ground terminal 11 in any implementation of operational amplifier 25. These are shown represented by a dashed line capacitance, 30, in FIG. 1.

Integration of the analog input signal with operational amplifier 25 is carried out using a further capacitance, 31, having one side thereof connected to inverting input 26 of amplifier 25. The opposite side of capacitor 31 (which has the greater value of parasitic capacitances associated therewith as indicated by an angular line for this capacitor plate) is selectively connected to output 28 of operational amplifier 25 through a switch to be described below.

A number of such switches are shown in FIG. 1, all in the form of n-channel MOSFET's each having a pair of terminating regions serving as a source and drain thereof under control of a gate region by which an effective conductivity between the terminating regions of the device can be established through selected voltage signals being applied thereto. Although n-channel MOSFET's are described for use as switches herein, other suitable switching devices could be used such as p-channel MOSFET's, parallel n-channel and p-channel MOSFET's, junction field-effect transistors, etc. The first of these MOSFET switches, 32, has one of its terminating regions connected to system analog signal input 10, and the other connected to ground reference terminal 11. MOSFET 32 has a gate, 33, shown brought out to the left at which a control signal can be provided to cause MOSFET 32 to effectively short together the terminals of the input analog signal current source, or of the series combination of an input analog signal voltage source and resistor, as either is connected between system analog signal input terminal 10 and ground reference reference 11 as earlier described.

On the other hand, a further MOSFET switch, 34, has one of its terminating regions also connected to system input terminal 10 but has its other terminating region connected to input region 26 of operational amplifier 25. MOSFET switch 34 has its gate, 35, shown brought out to the left in FIG. 1 at which a control signal can be provided to cause MOSFET switch 34 to connect system input terminal 10 with operational amplifier inverting input 26.

A further MOSFET switch, 36, has one of its terminating regions connected to non-inverting input region 26 of operational amplifier 25 and the other of its terminating regions connected to output 28 of operational amplifier 25. MOSFET 36 has its gate, 37, also brought out to the left in FIG. 1. A control signal at gate 37 of MOSFET 36 which switches it into the "on" condition will (if transistor 34 is in the "off" condition) prevent any integration by operational amplifier 25. Effectively, amplifier 25 then has a gain of approximately one with respect to its non-inverting input 27.

Yet another n-channel MOSFET, 38, has one of its terminating regions connected to capacitor 31 and the other of its terminating regions connected to output 28 of operational amplifier 25. Thus, MOSFET switch 38 has its gate, 39, also brought out to the left in FIG. 1, subject to receiving a control signal which will connect capacitor 31 in a feedback arrangement about operational amplifier 25 as indicated above.

Finally, the last n-channel MOSFET switch shown, 40, has one terminating region thereof also connected to capacitor 31 but with the other connected to output 23 of staircase signal generator 21. The gate, 41, of MOSFET switch 40 can have a control signal applied thereto to connect capacitor 31 directly to output 23 of staircase signal generator 21 so that the voltage levels generated by staircase signal generator 21 are provided to the circuitry associated with operational amplifier 25 in FIG. 1.

An AND gate, 42, has an input thereof connected to output 28 of operational amplifier 25 and has its output connected to WRITE input 17 of memory register 13. This permits operational amplifier 25 to provide an output signal through AND gate 42 to WRITE input 17 of memory register 13 to cause memory register 13 to store a count occurring at its inputs 16. The remaining input, 43, of AND gate 42 receives an ENABLE signal controlling the times that operational amplifier 25 can provide an output signal to cause such an effect in register 13 in a conversion cycle. A RESET signal is also provided ot an input, 44, of counter means 18 to reset the counter to a zero count for each conversion cycle.

Figure 2:
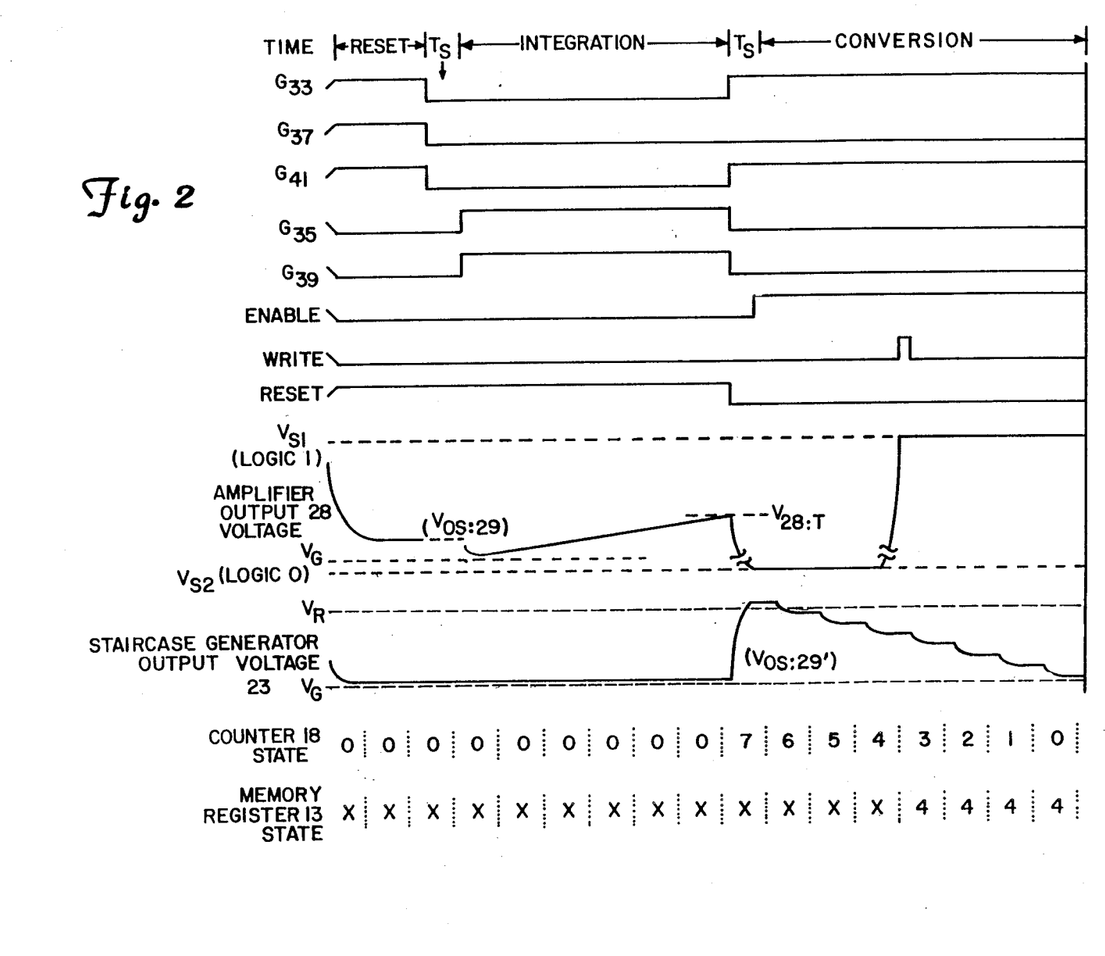
FIG. 2 shows various waveforms and digital states occurring during operation of a system similar to that of FIG. 1, FIGS. 3A and 3B show an embodiment of a staircase signal generator and its operating waveforms.

FIG. 2 shows operating waveforms and logic state diagrams versus time at various points in the circuitry of FIG. 1 (actually for a very similar circuit as will be indicated below). These waveforms and digital device logic state diagrams shown in FIG. 2 will be used to explain the operation of FIG. 1. The time axis shown at the top of FIG. 2 shows a breakdown of the time of one conversion cycle into three major operational modes to complete a conversion from an analog value to a corresponding digital code representation for that conversion cycle. The first portion of the conversion cycle time period is taken up in the reset mode in which the system of FIG. 1 is readied for subsequent integration and conversion. The close of the reset mode leads to the integration mode after a short settling time designated by $T_s$ in FIG. 2. During the integration mode, the signal occurring at system input 10 undergoes time integration which has the effect of removing higher noise frequency, as previously indicated. The value reached during this integration period is converted to a digital code representation in the subsequent conversion mode after another short settling time again designated $T_s$.

During the reset mode portion of the conversion cycle, gate signals at gates 33, 37 and 41 in the high logic state voltage level lead to MOSFET's 32, 36 and 40 being switched into the "on" condition while low logic state voltage levels at gates 35 and 39 lead to transistors 34 and 38 being in the "off" condition. This results in the analog signal source between terminals 10 and 11 in FIG. 1 having any signal therefrom being shunted to ground during this mode, and this source being disconnected from inverting input 26 of operational amplifier 25. Operational amplifier 25 is converted into an amplifier having a gain of approximately one with respect to its non-inverting counterpart 27 so that the value of the offset voltage in offset voltage generator 29 appears at output 28 of operational amplifier 25 with respect to the ground reference voltage on terminal 11. In addition, parasitic capacitor 30 is charged to the offset voltage generated by offset voltage generator 29.

Reset input 44 of counter 18 has the RESET signal applied thereto in the high logic state voltage level thereby holding the output of counter means 18 at a desired value, here taken to be all low logic state voltage level signals at outputs 20 or all logic zeros. Counter 18 for this example is chosen to be a down counting counter. With the logic values at outputs 20 of counter 18 being all zeros, the output of staircase signal generator 21 is also at approximately zero volts except for the offset voltage of generator 29' at its output. Capacitor 31 has the offset voltage at output 23 of staircase signal generator 21 applied to one side thereof through transistor 40, and has the offset voltage of operational amplifier 25 applied to the other side thereof from the output of amplifier 28 through transistor 36. Thus, any remaining voltage on capacitor 31 from the previous conversion cycle will be dissipated through the outputs of staircase signal generator 21 and operational amplifier 25, and the difference in these two offset voltages from generators 29 and 29' will be the voltage remaining across capacitor 31.

Enable input 43 of AND gate 42 has the ENABLE logic signal applied thereto being at the low logic state voltage level. In this condition, the output of AND gate 42 will also be at the low logic state voltage level and, in such a condition, will prevent memory register 13 from accepting and storing any digit signals appearing at its input 16 from counter means 18 (which in the present mode as previously explained are all zeros).

At the end of the reset mode, there is shown in FIG. 2 a short settling time $T_s$ which is provided by transistors 32, 36 and 40, previously switched into the "on" condition in the reset mode, now being switched into the "off" condition to start this settling time. The settling time is ended by having transistors 34 and 38, which were previously in the "off" condition, now switched to the "on" condition to also start the integration mode in this conversion cycle.

During this first settling time between the reset and integration modes, with all of the MOSFET switches in the "off" condition, there is no feedback provided about operational amplifier 25 with the result that the voltage at its output 28 can take any of a wide range of values. Thus, no particular value has been shown in this portion of the amplifier output waveform in FIG. 2. The continuation of the voltage at output 28 of amplifier 25 occurring at the end of the reset mode, which as the offset voltage at inverting input 26 of operational amplifier 25, is shown in this settling time portion and designated $V_{os:29}$. The value for $V_{os:29}$ is shown positive in the amplifier output waveform of FIG. 2.

The system of FIG. 1 as shown is configured to have the analog input signal input current between terminals 10 and 11 thereof flow in only one direction, a unipolar signal, the direction being out of terminal 10 and into terminal 11 as earlier indicated. The system of FIG. 1 can be configured to operate in a bipolar manner by adding to the input signal source a current flowing from terminal 10 into terminal 11 about half the maximum input signal permitted. Then, the input signal current could be permitted to flow either from terminal 10 into terminal 11, or vice versa, as long as it did not exceed approximately half of the input current permitted in the system of FIG. 1. Alternatively, as will be seen below, the reference voltage provided on terminal 24 could be switched to the opposite polarity each time the input signal value being converted to a digital code changes flow direction in FIG. 1, either flowing from terminal 11 into terminal 10 or the reverse.

In addition, the amplifier output waveform at its output 28 shown in FIG. 2 for an input analog current having a single flow direction is drawn to suggest that the system need not necessarily have a large signal swing between the ground reference value and the logic zero value. Operational amplifier 25 will operate between its positive saturation voltage, $V_{S1}$, and its negative saturation voltage, $V_{S2}$. $V_{S2}$, however, need not be the same value as $V_{S1}$, and the negative power supply voltage value for operational amplifier 25 may well not be chosen to be of as large a voltage magnitude as the positive one where the input signal current flows in only one direction.

As the settling time between the reset mode and the integration mode for the system of FIG. 1 comes to a close with the switching into the "on" condition of transistors 34 and 38, feedback is again established about operational amplifier 25 through capacitance 31. Since capacitance 31 has been charged to the difference in offset voltages provided by offset voltage generators 29 and 29', and since the closing of the feedback requires charging capacitance 31 to $V_{os:29}$ of generator 29 but to the opposite polarity, output 28 of operational amplifier 25 is driven toward $V_{os:29'}$, the difference between the voltage of generator 29 and voltage previously stored on capacitance 31. Although the voltage on output 28 of amplifier 25 is shown to be at the ground reference voltage in FIG. 2, in most instances this voltage will not reach that $V_{os:29'}$ voltage value because integration of the input analog signal present between terminals 10 and 11 in FIG. 1 will have simultaneously begun. This is because terminal 10 has been connected to inverting input 26 of operational amplifier 25 by transistor 34 being switched to the "on" condition following the earlier switching of transistor 32 to the "off" condition.

For purposes of the example in FIG. 2, the input analog signal has been chosen to be a constant current at an arbitrary value flowing from terminal 10 into terminal 11. The result is that a steadily increasing with time linear voltage waveform appears at output 28 of operational amplifier 25 because of the constant current charging of capacitance 31. That is, a steady current drawn by the input analog source from terminal 10, and so from inverting input 26 of amplifier 25, leads to a constant current being supplied by output 28 of operational amplifier 25 to charge capacitor 31. The constant current charging capacitor 31 leads to a linear voltage rise at output 28 of operational amplifier 25 during the integration period for this example. Because parasitic capacitor 30 remains at the offset voltage of generator 29 during the integration mode, the presence of parasitic capacitor 30 does not contribute to error during this integration mode by drawing any current.

During the integration mode, reset input 44 of counter means 18 has the RESET signal applied thereto at the high logic state voltage level, thus continuing to keep counter 18 with all logic zero voltage values at outputs 20 thereof. Enable input 43 of AND gate 42 has the ENABLE signal applied thereto at the low logic state voltage level leading to a similar zero or low logic state voltage level occurring at the output of AND gate 42 which is supplied to WRITE input 17 of memory register 13. Memory register 13 therefore continues to be unable to accept and store any logic values appearing at inputs 16 thereof.

The time of integration in the integration mode will be designated by T. The resulting voltage appearing at output 28 of operational amplifier 25 after the integration time T has expired will be designated $V_{28:T}$. This will be $$V_{28:T} = V_{os:29'} + \frac{1}{C_{31}} \int_{t=0}^{t=T} i_{in} dt$$

where $V_{os:29'}$ is the offset voltage of generator 29' while the voltage across capacitance 31 will be:

$$V_{31:T} = V_{os:net} + \frac{1}{C_{31}} \int_{t=0}^{t=T} i_{in} dt$$

where $V_{os:net}$ is the net offset voltage of generators 29 and 29', $V_{os:net} = V_{os:29'} - V_{os:29}$. As can be seen, the storage of the generator 29 offset voltage on capacitor 31 removes it from the output of operational amplifier 25 leaving only the generator 29' offset voltage.

The value chosen for the integration time T is a compromise between system gain, on the one hand, and the rate at which samples can be converted to digital code on the other. The value chosen for the integration time T is, of course, set by the control signals appearing at gates 33 and 35 of transistors 32 and 34, respectively, acting to switch into the system the analog input signal source provided between terminals 10 and 11, to inverting input 26 of operational amplifier 25 and by connecting capacitance 31 into a feedback loop about amplifier 25. Such gate control signals are easily varied so that the integration time T need not be of a fixed time duration.

Thus, if a maximum signal is desired at output 28 of operational amplifier 25 before a code equivalent is found in the conversion mode, the signal at output 28 of operational amplifier 25 in FIG. 1 could be supplied also to a comparator (not shown in FIG. 1) and compared with a reference voltage set to the maximum value to be permitted for this output signal. The comparator output would then be used to control the signals applied to gates 33, 35 and 39, for instance, so that the integration time would continue until the voltage at output 28 of operational amplifier 25 reached the reference voltage supplied to the comparator. This would assure that a maximum signal at output 28 of amplifier 25 was reached and so that the maximum gain for the conversion system was in effect at the time that the conversion mode is entered. In other conversion cycles, the input signal could be set to integrate for the same amount of time as in the cycle during which use was made of this output signal comparator so that the same relative amplitude relationships between various samples would be maintained. The system gain could be periodically checked for purposes of adjustment, and a record could be kept in a memory of the gains used with respect to each set of input analog signal samples converted under a particular gain.

As just indicated, the integration mode portion of the conversion period comes to an end when (i) transistor 32 is switched from the "off" condition to the "on" condition to provide a short circuit about the input analog signal source, (ii) transistor 34 is switched from the "on" condition to the "off" condition disconnecting terminal 10 from inverting input 26 of operational amplifier 25, and (iii) transistor 38 is switched from the "on" condition to the "off" condition to remove capacitance 31 from being in a feedback loop about operational amplifier 25 so that the amplifier 25 is no longer part of an integrator system. This begins another settling time period, again designated $T_s$, between the integration mode and the conversion mode in which the voltage at output 28 of operational amplifier 25 after integration, $V_T$, is converted to its nearest digital code equivalent. Transistor 36 remains in the "off" condition and so does not affect the operation of the system during either the integration or the conversion modes.

Two further switching actions at the end of the integration mode set circuit conditions for the beginning of the subsequent conversion mode. First, the RESET signal drops from the high logic level voltage state to the low state level to permit counter means 18 to begin counting downward from zero in the binary number system. The second switching action, in effect, continues the conversion of operational amplifier 25 from operating as an integrator, as just described, to operating as a comparator with inverting input 26 as the input for the voltage to be compared with the ground reference voltage, or zero volts, connected to non-inverting input 27 of operational amplifier 25. This changeover of operating function of amplifier 25 is completed by transistor 40 being switched from the "off" condition to the "on" condition. The result is to connect output 23 of staircase signal generator 21 to the side of capacitance 31 which had previously been connected to output 28 of operational amplifier 25 by transistor 38. Thus, the voltage to be compared with the ground reference voltage by operational amplifier 25 is the voltage provided at output 23 of staircase signal generator 21 less the voltage stored on capacitance 31 at the end of the integration mode.

The results of this comparison are converted to a digital code representation thorough this action of operational amplifier 25 serving as a comparator after the conversion mode has actually been begun by the ENABLE signal switching to the high logic state voltage level. When the voltage provided by staircase signal generator 21 at its output 23, less the voltage across capacitor 31, is greater than the generator 29 offset voltage, output 28 of operational amplifier 25 will be driven to its negative saturation value, $V_{S2}$, which serves as a logic zero insofar as the input to AND gate 42. As the voltage provided by staircase signal generator 21 is reduced with each count of counter means 18 being supplied to inputs 22 of generator 21, a voltage at output 23 will finally be reached where that voltage less the voltage stored on capacitor 31 during the integration mode is equal to or less than the generator 29 offset voltage. When this occurs, the voltage at output 28 of operational amplifier 25 will be driven rapidly to its positive saturation voltage, $V_{S1}$.

The switching of the ENABLE logic signal from a low logic state voltage level, or "0" logic state voltage level, to a high logic state voltage level, or "1" logic state voltage level, permits such a logic level change from output 28 of operational amplifier 25 to be transmitted through AND gate 42 to WRITE input 17 of memory register 13. A "1" logic state on WRITE input 17 of memory register 13 will cause register 13 to at that time of logic state change to store whatever binary count is at its inputs 16 which has been provided there from counter means 18. Thus, the WRITE signal in FIG. 2 represents the logic signal versus time at the output of AND gate 42 and so at WRITE input 17 of memory register 13. However, in FIG. 2 a pulse is shown rather than a maintained logic state voltage level which would be sufficient for the system of FIG. 1 if the conversion mode activities were terminated with such a logic state shift. On the other hand, alternative embodiments described below continue with conversion mode activities including the downward counting process. In these circumstances, a single pulse must be used so that the memory register 13 involved does not accept and store further input counts from counter means 18.

As indicated above, the RESET logic signal applied to input 44 of counter means 18 is switched from the high logic state voltage level, or "1" logic state voltage level, to a "0" logic state voltage level to remove the constraint on counter means 18 which previously held its N outputs 20 in a logic state of all zeros. This permits counter means 18, which as indicated earlier is a down counting counter, to switch from all zeros first to $2^N$ represented by to all ones and then to continue its downward counting one binary number value for each system clock pulse appearing at clock input 19 of counter means 18-11 . . . 10, 11 . . . 01, 11 . . . 00, etc. This can be seen in the counter 18 state logic diagram in FIG. 2 which, for purposes of illustration, has been shown to be a counter which has only eight counting states rather than $2^N$ states where N might typically range from 6 to 10 but could range from 1 to 14 or more that a typical counter chosen in practice would have. The memory register state logic diagram in FIG. 2 has X's in each time period in which no inputs are accepted for storage in memory register 13 through the reset and integration modes and into the conversion mode until after the pulse in the WRITE signal. These diagrams assume that this pulse occurs when the voltage at output 23 of generator 21 is at a value set by the fourth count state of counter 18. In both of these logic state diagrams, the states are represented by decimal numbers rather than the binary number actually denoting them in practice.

If staircase signal generator 21 is formed by use of a digital-to-analog converter, as suggested in FIG. 1, the application of all zeros at outputs 20 of counter 18 to inputs 22 of generator 21 leads to zero volts (ignoring the offset of generator 29') at output 23 of generator 21. With a voltage of $V_R$ as the reference voltage applied to terminal 24 of generator 21, this voltage $V_R$ is, in effect, multiplied by such a zero value at inputs 22 of generator 21 to give this output 23 voltage value of zero volts. As the counter counts down first to all ones, the voltage at output 23 becomes equal to $V_R$ as, again, in effect, this value of one at the output of generator 21 is multiplied by $V_R$. With further counting down of one binary count value for each clock pulse input at clock input 19 of counter 18, this same effective multiplication of that fractional value occurring at inputs 22 of generator 21 is multiplied by $V_R$ to continue to reduce the output voltage at output 23 of generator 21 in each clock period by an amount equal to the fractional value of the binary count times $V_R$.

The result is shown in the staircase signal generator output 23 voltage waveform in FIG. 2. This voltage is shown there being at zero during the time the RESET high logic value was maintained. Thereafter, the staircase signal generator output 23 voltage switches up to $V_R$ and then is decremented down toward the ground reference voltage. Each decrement is shown to be of a constant voltage amount in each logic state in the sequence thereof caused to occur by the clock pulses at input 19 of counter 18. Thus, the voltage at output 23 of generator 21 continues to fall, as driven downward by counter 18, so that ultimately this voltage, less the voltage stored on capacitance 31, is reduced at inverting input 26 of operational amplifier 25 to equalling or fully below the offset voltage due to offset voltage generator 29 (assumed in FIG. 2 to occur in the fourth count state). Changing the polarity of $V_R$, and so of the output 28 voltage, would accommodate a change in the direction of the analog signal input current of terminals 10 and 11 in accord with the previous discussion of the input signal as a unipolar and as a bipolar signal.

The use of unequal voltage decrements from generator 21 can alternatively be arranged. Such unequal decrements, for instance, could be used to compensate nonlinearities on the system or input signal source or for the dynamic range compression.

At the end of the integration mode and the start of the settling period leading to the start of the conversion mode accompanied by the application of $V_R$ by generator 21 at its output 23 across capacitance 31, and inevitably across parasitic capacitance 30, there will be some charge splitting between these two capacitors. Such splitting leads to an initial error in the voltage actually being sensed at inverting input 26. However, this error has no effect in the initial converting mode stages because the only information trasmsmitted by operational amplifier 25 is at the final stage where the voltage being compared reaches a value at inverting input 26 of operational amplifier 25 equal to the generator 29 offset voltage. However, at this point, the voltage splitting is effectively eliminated since the generator 29 offset voltage has been already stored and maintained on parasitic capacitor 30, as earlier indicated, and as a comparison match is approached the conditions of this initial storing are effectively reproduced. Hence, the result is that at the time of actually sensing an equality between the voltage to be compared with the generator 29 offset voltage, there is no error remaining due to parasitic capacitance voltage splitting, and an accurate comparison is thus made with the voltage provided by staircase signal generator 21.

Also, the offset voltage due to generator 29' was earlier stored on capacitance 31 as previously described. Since the voltage provided for comparison at inverting input 26 of operational amplifier 25 is the output 23 voltage of staircase signal generator 21 less that stored on capacitance 31, this earlier stored generator 29' offset voltage is cancelled by the generator 29' offset voltage currently occurring at output 23 during the conversion mode.

The voltage provided by staircase signal generator 21 at the time that such generator voltage, less the voltage in capacitance 31, equals the generator 29 offset voltage to thereby satisfy the comparison test of operational amplifier 25, requires that the voltage at output 23 of generator 21 cancel the right-hand term in the last equation above in the voltage reached across capacitance 31 at the end of an integration time T (and that of offset voltage generator 29' which it does as just described). This is true because the generator 29 offset voltage has also been earlier stored on capacitance 31, as previously indicated, and this is just the voltage that must be reached between ground and inverting input 26 to cause operational amplifier 25 to switch its output 28 from the negative saturation voltage $V_{S2}$ to its positive saturation voltage $V_{S1}$. Thus, the voltage at output 23 of staircase signal generator 21 at the point of switching is desired to be $$V_{23:CONV.SW.-d} = V_{os:29'} + \frac{1}{C_{31}} \int_{t'=0}^{t=T} i_{in} dt$$

However, the voltage value at output 23 of converter 21 can only change in discrete amounts, as described above. The smallest amount of such voltage changes, effectively in using a digital-to-analog converter, being the value of a single binary count at its input times the reference voltage $V_R$ at its reference input 24. This represents "quantization error" and means that the voltage at output 23 of staircase signal generator 21 could miss the value set forth by the last equation by up to this smallest discrete change. Since the value assigned to a binary count will depend on how many binary counts are required to drive the digital-to-analog converter from zero to its full reference value $V_R$, there is obviously an improvement in resolution in using a greater number of count states to accomplish such a swing in voltage at output 23 of staircase signal generator 21. Thus, the choice of a staircase signal generator 21 requiring a greater number of counts to cause its output voltage to change a given amount, and a counter means 18 which can provide such a greater number of counts, will improve resolution of the converter. On the other hand, this requires counting through a larger number of logic states and will tend to slow the rate of conversions of the analog input signal samples to equivalent digital code representations.

A way to represent the actual output voltage at output 23 of staircase signal generator 21 would be as follows:

$$V_{23:CONV.SW.-a} = \frac{V_R}{2^N} \cdot (\text{DECIMAL VALUE OF BINARY COUNT}) + V_{os:29'}$$

where $V_{23:CONV.SW.}$ is the actual value reached of the output voltage of generator 21 just after output 28 of operational amplifier 25 has shifted from $V_{S2}$ to $V_{S1}$. Thus, the binary count reached to cause generator 21 to provide the voltage $V_{23:CONV.SW.}$ forms a representation in a digital format of the nearest power voltage value which generator 21 can provide to the voltage value actually stored on capacitor 31 as a result of the integration of $i_{in}$. This binary count, because of the pulse generated in the WRITE signal at the output of AND gate 42 due to the switching from $V_{S2}$ to $V_{S1}$ at output 28 of operational amplifier 25, is stored in memory register 13 as indicated above. Thus, this stored binary count becomes available at outputs 14 of memory register 13 and so at the conversion system outputs 15 to represent the time integral of $i_{in}$ during the sampling or integrating time T.

While the foregoing description indicated that a digital-to-analog converter was a suitable circuit system for staircase signal generator 21 in the system of FIG. 1, the use of a digital-to-analog converter, if implemented in a monolithic integrated circuit, requires a substantial amount of chip surface area and, in general, provides a far more capable staircase signal generator 21 than is usually needed. An alternative, also indicated in FIG. 1, would be to use a switch capacitor circuit, typically a switch capacitor integrator, to provide the staircase voltage waveform at output 23 of generator 21.

Switched capacitor circuits are especially well suited for fabrication in a monolithic integrated circuit based on MOSFET transistor technology. A switched capacitor integrated for these purposes as an alternative to a digital-to-analog inverter is shown in FIG. 3A.

Figure 3A:
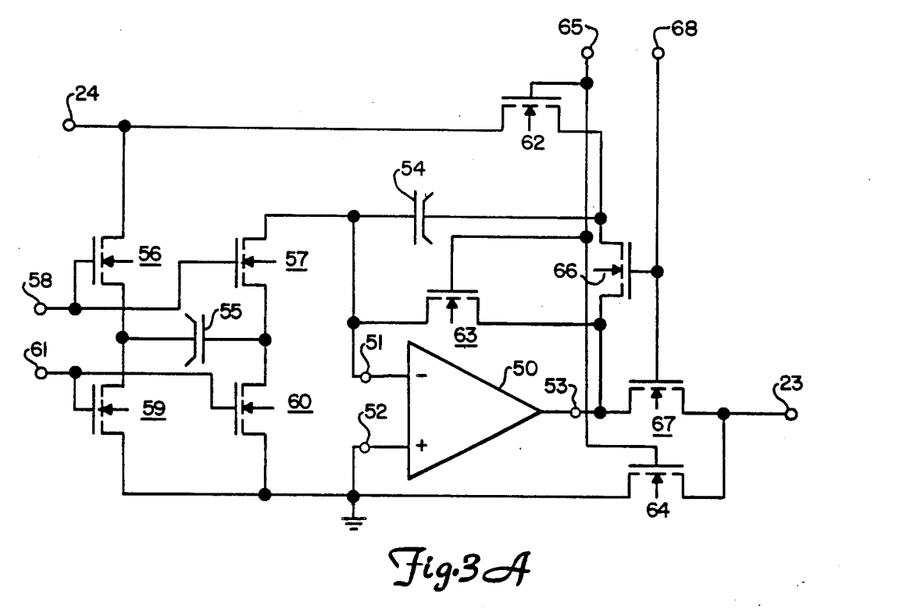

The switched capacitor integrator of FIG. 3A is formed around a further operational amplifier, 50, having an inverting input, 51, and a non-inverting input, 52. Each of these inputs is of a relatively high circuit impedance to ground and to each other while operational amplifier 50 has an output, 53, of relatively low circuit impedance to ground.

Two capacitances are used, the first, 54, being connected between inverting input 51 of operational amplifier 50, and also being connected selectively by a switch to output 53 of operational amplifier 50 to form a feedback arrangement. The other capacitance, 55, is connected between two pairs of switches which can switch this capacitance between reference voltage terminal 24 and inverting input 51 of operational amplifier 50 in one switch setting, and switch both sides of capacitance 55 to ground in the other. The switches used in the circuit of FIG. 3A are again formed of n-channel MOSFET transistors each having a pair of terminating regions serving as source and drain thereof, and a gate which can have a voltage signal applied thereto to control the conductivity between its corresponding terminating regions.

Two of these transistors, 56 and 57, form the first pair of switches used with capacitance 55 and have their gates tied to a common control input, 58. Transistor 56 has a terminating region connected to voltage terminal 24 with its other terminating region connected to one side of capacitance 55. Transistor 57 has one of its terminating regions connected to the other side of capacitance 55, and its remaining terminating region connected to inverting input 51 of operational amplifier 50.

Two further transistors, 59 and 60, have the gates thereof connected to another common control terminal, 61. Transistor 59 has one terminating region thereof connected to that side of capacitance 55 to which transistor 56 is connected. The other terminating region of transistor 59 is connected to the ground reference voltage. One terminating region of transistor 60 is connected to the opposite side of capacitance 55 from that connected to transistor 59, and its remaining terminating region is also connected to the ground reference voltage.

Three further transistors, 62, 63 and 64, each have their gates connected to a further common control terminal, 65. One terminating region of transistor 62 is connected to voltage reference terminal 24. The other terminating thereof region is connected to one side of capacitance 54. One of the terminating regions of transistor 63 is connected to the inverting input 51 of operational amplifier 50, while the other is connected to output 53 of oprational amplifier 50. One terminating region of transistor 64 is connected to staircase signal generator output 23 with the remaining terminating region of transistor 64 being connected to the ground reference voltage.

Finally, two further transistors, 66 and 67, each have their gates connected to a further control terminal, 68. Transistor 66 has a terminating region thereof connected to one side of capacitance 54. The other terminating region of transistor 66 is connected to output 53 of operational amplifier 50. One of the terminating regions of transistor 67 is connected to output 53 of operational amplifier 50 also. The other terminating region thereof is connected to staircase signal generator output 23.

Figure 3B:
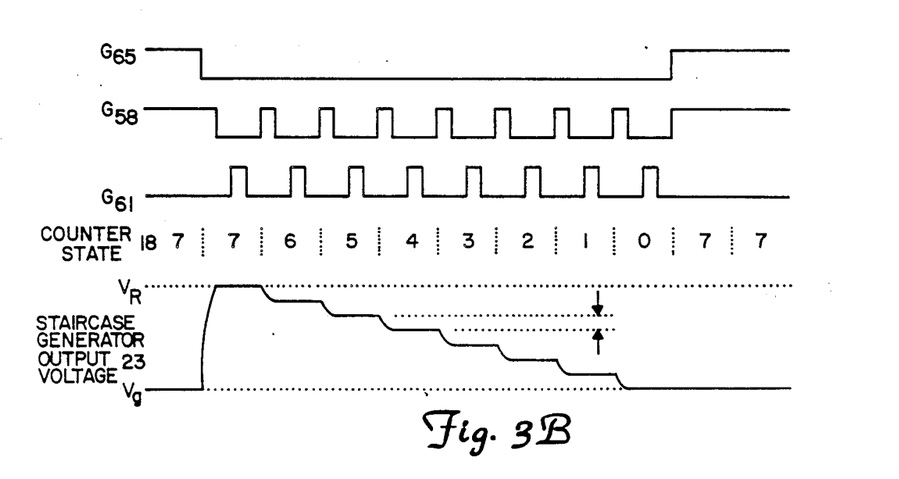

The logic control signal at control input 65 shown in FIG. 3B, and its direct complement signal at control terminal 68, prepare the system of FIG. 3A in each conversion cycle to provide a staircase voltage waveform at output 23 during the conversion mode portion of that conversion cycle. Transistors 62, 63 and 64 are all switched into the "on" condition by the initial portion of the waveform shown in FIG. 3B for the gates connected to control terminal 65. Conversely, transistors 66 and 67 are switched into the "off" condition. This situation renders operational amplifier 50 as a unity gain amplifier and isolates output 53 thereof from output 23 of the system. Further, capacitance 54 is thereby connected between inverting input 51 of operational amplifier 50 and the reference voltage $V_R$ applied to reference voltage terminal 24. As a result, capacitor 54 is charged to the reference voltage $V_R$.

In addition, the transistors connected to control input 58 are switched into the "on" condition during this time so that capacitance 55 is connected through transistors 56 and 57 between voltage reference terminal 24 and inverting input 51 of operational amplifier 50. Thus, capacitance 55 also charges to $V_R$ in this initial system preparation.

The signal applied to control input 65 then goes to the low logic level to thereby switch transistors 62, 63 and 64 into the "off" condition. The complementary signal at control input 68 switches transistors 66 and 67 into the "on" condition. Operational amplifier 50 thereby has its output 53 connected to system output 23, and capacitance 54, still charged to $V_R$ is connected between converting input 51 and output 53 of this amplifier.

During the remainder of the conversion mode portion of the conversion cycle, transistors 56 and 57 alternate with transistors 59 and 60 in switching from the "on" condition to the "off" condition. This results in capacitance 55 being first discharged by transistors 59 and 60 and then being charged again to $V_R$ through transistors 56 and 57, this charging also causing a similar current to flow in capacitance 54. The ratio of the capacitance value of capacitance 55 to that of capacitance 54 determines the voltage change across capacitance 54 that occurs as capacitance 55 is again charged to $V_R$. This voltage change across capacitance 54 is reflected by an equal change in voltage at output 53 of operational amplifier 50. This voltage change is that voltage portion shown between the two vertical arrows given in the example in FIG. 3B for the staircase signal generator output 23 voltage. This switching sequence continues until the voltage at system output 23 is reduced to the ground reference voltage.

Figure 4:
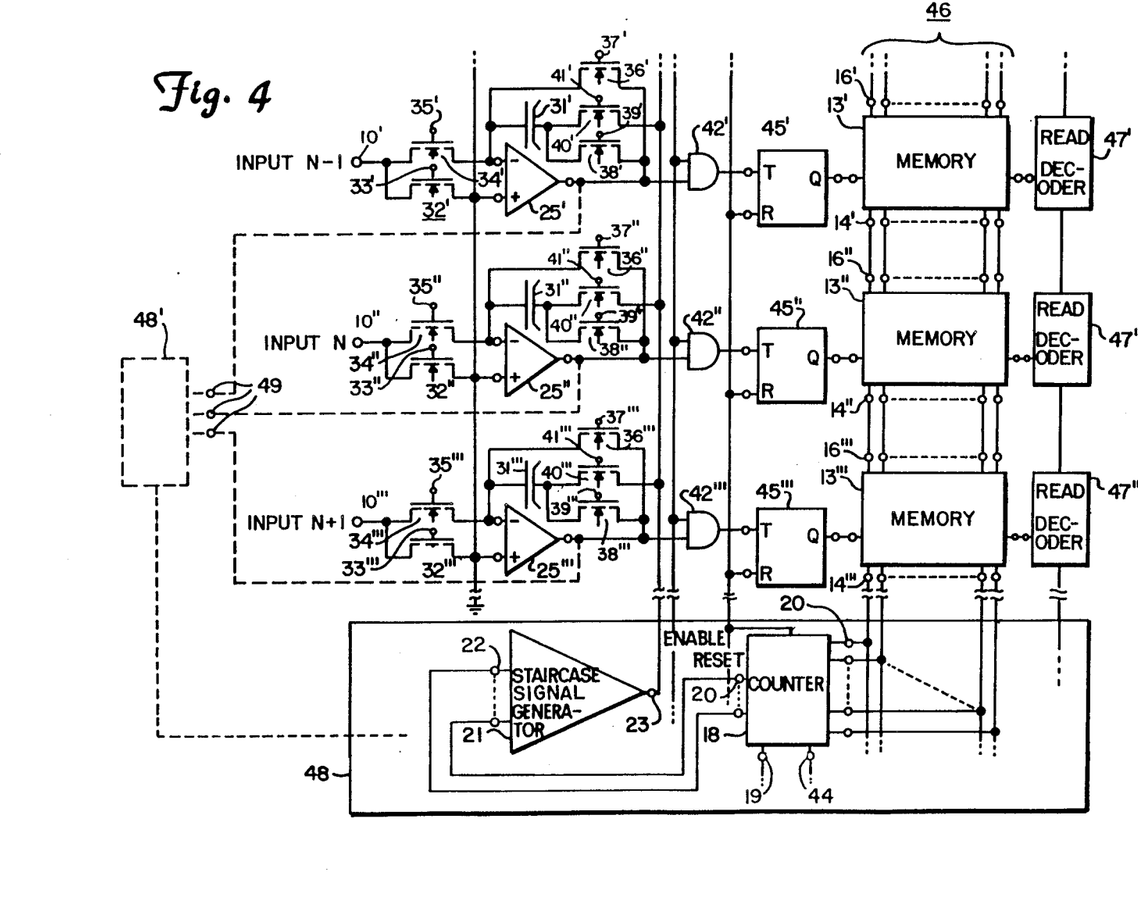
FIG. 4 shows an alternative embodiment of the present invention.

Returning now to FIG. 1, the system shown there can be extendede to provide simultaneous conversions to digital code representations of a plurality of analog input signals as is shown in FIG. 4. There is shown in FIG. 4 a representative few of such a plurality of analog signal input terminals for conversion systems for such signals and the associated conversion system for each. In particular, the conversion systems for the n−1, n and n+1 analog signal sources only are shown in FIG. 4.

As can be seen from the figure, staircase signal generator 21 and counter means 18 need not be duplicated but can serve each conversion system associated with an analog signal input. The other components of the system of FIG. 1 are duplicated in the multiple conversion system of FIG. 4 and carry the same numerical designations there that they had in FIG. 1, except for the addition of one or more prime marks to such designations. In FIG. 4, a single prime mark has been added to these designating numerals for those components involved in the conversion system associated with the analog signal input n−1. Two such prime marks have been added to these numerical designations for those components associated with conversion system for analog signal input n, etc. Each conversion system associated with an analog signal input operates essentially as does the conversion system of FIG. 1 with some minor changes.

A "one-shot" or single pulse generator, 45, would have to be added to the system of FIG. 1 between AND gate 42 and memory register 13 for the system of FIG. 1 to be used in the multiple conversion channel arrangement of FIG. 4. Such a pulse generator has been added with each conversion channel and has the number of prime marks added to the numerical designator 45 appropriate for that channel. The need for this addition was indicated in the disucssion of the showing of a pulse rather than a level shift only in connection with discussion of the WRITE signal of FIG. 2. This pulse generator assures that a single pulse is transmitted by each operational amplifier and AND gate pair in a conversion system to the corresponding memory WRITE input during the conversion mode, and cannot be repeated again during the conversion cycle containing that conversion mode. In these circumstances, the memory in the conversion channel will only take an input set of digits from counter 18 once in a conversion cycle despite additional counts being provided to that memory during the remainder of the conversion mode. Each single pulse generator in FIG. 4 is connected to a signal line marked RESET to reset this generator to be able to provide another single pulse in the next conversion cycle.

The counts supplied by the single counter 18 in the system of FIG. 4 are supplied along a digital signal bus, 46, which is connected to both the input and the output terminals of the memory register in each conversion system. Thus, counts from counter 18 are continually presented to the inputs of each memory during that portion of the conversion mode that digital code representations for each conversion system are being established. Later in the FIG. 4 system conversion mode, a READ decoding arrangement must be used to obtain the digital code representations found for each analog input signal sample during the current conversion cycle which have been stored in the corresponding memory by directing the memories to serially provide these representations on bus 46. These READ decoders are designated by the numerical designator 47 with an addition of prime marks appropriate to the conversion channel in which each is located. Alternatively, the READ decoding could be arranged on any selected basis to thereby allow obtaining the contents of these memories in an arbitrary order.

A timing and control block, 48, is shown in FIG. 4 which contains staircase signal generator 21 and counter means 18 as well as the numerous other control circuits necessary for operating this system. These control circuits in block 48 operate to assure that the operation of each of the conversion channels in FIG. 4 parallels that of the system shown and described in connection with FIG. 1. The signal line labeled RESET in FIG. 4 is not to be confused with the counter 18 reset signal applied at terminal 44 thereof to reset this counter to a zero count value. The signal line marked RESET in block 48, as explained above, is for resetting the single pulse generators.

An extension of block 48 is a further block, 48', which has connected at its inputs, 49, interconnections from the outputs of the operational amplifiers used in each of the conversion channels shown in FIG. 4. This allows for checking the voltage value reached at each operational amplifier output during the integration mode for purposes of setting the integration time T for the system of FIG. 4 to thereby set the gains of each of the conversion systems in FIG. 4 as explained in connection with the system of FIG. 1. If the gain of each conversion system, or the time of integration for that channel, is to be considered in controlling the system of FIG. 4, there will be a comparator and a reference voltage in block 48' for each input 49 thereof. The output of each comparator could then be provided to block 48 to end the integration time of only the corresponding coversion system. Alternatively, the first conversion system which reaches a comparator reference voltage can be used to set the time of integration for all of the conversion systems of FIG. 4, this information being transferred from block 48' into block 48 to control the timing of the signals therein which are sent to the various switching transistors, the AND gates, etc.

As a further alternative, the conversion channel gain can be controlled on the basis of the average of all of the operational amplifiers reaching a selected reference level. Block 48' would then provide a summing amplifier therein which would have a summing input thereof connected to each of inputs 49. The sum of the conversion systems operational amplifier output signals would be compared against a reference voltage level, and when this sum (related to the average by a scaling factor) reached this reference voltage level, block 48' would provide an indication to block 48 to end the integration time for all of the conversion channels in the system.

Figure 5:
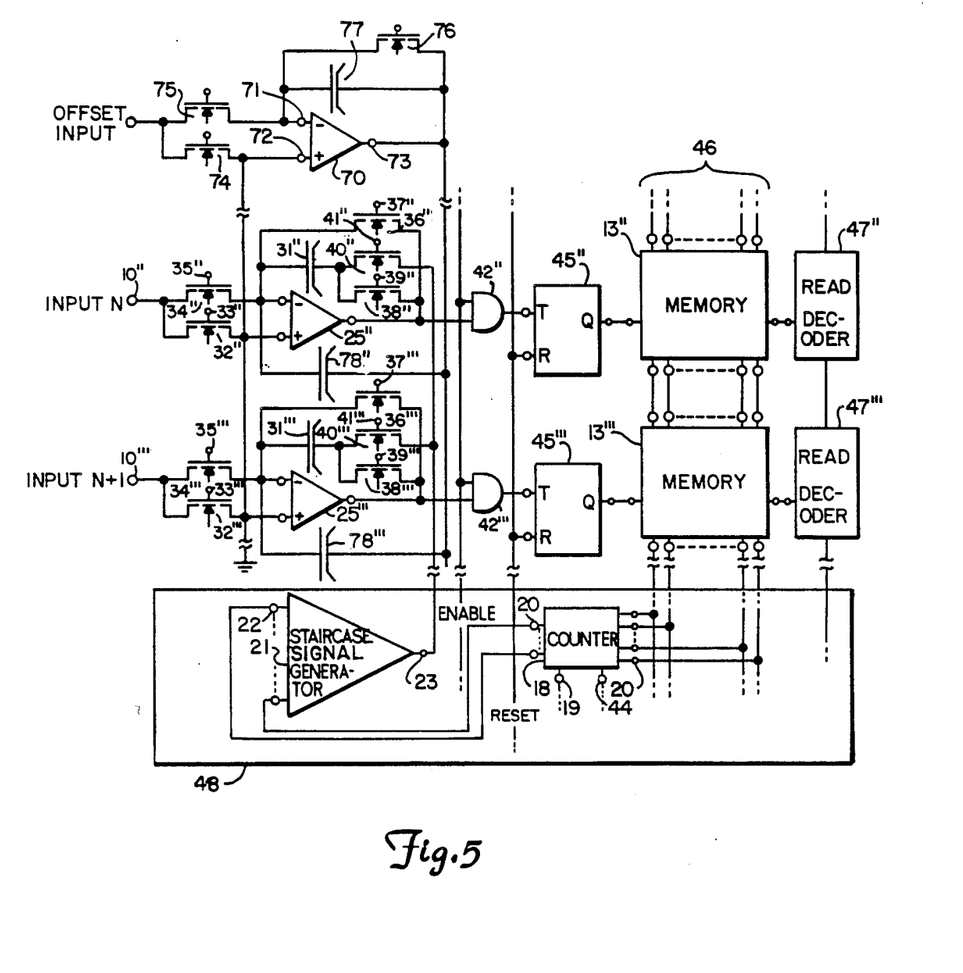
FIG. 5 shows a further alternative embodiment of the present invention.

FIG. 5 shows an adaptation of the system shown in FIG. 4, the conversion system associated with analog input n−1 having been omitted from the conversion system examples being shown in FIG. 5. An additional system has been added which permits cancelling a portion of each of the analog input signals in an amount equal to a common cancellation signal value provided in an offset analog input signal. This additional system is shown in connection with a cancellation analog signal input designated "Offset Input" in FIG. 5. The added system involves a further operational amplifier, 70, having an inverting input, 71, and a non-inverting input, 72, both of relatively high circuit impedance to ground and one another. Amplifier 70 has an output, 73, of a relatively low circuit impedance to ground. A pair of n-channel MOSFET transistors, 74 and 75, are used to provide or remove a short circuit around the offset analog input signal source, and to connect that source to inverting input 71 of operational amplifier 70, respectively.

A further n-channel MOSFET, 76, can connect output 73 of operational amplifier 70 to inverting input 71 of that amplifier. Another capacitance means, 77, to be used for integration has one side thereof connected to output 73 of operational amplifier 70 and the other side of capacitance 77 is connected to inverting input 71 of operational amplifier 70. Output 73 of operational amplifier 70 is connected to the inverting input of each of the operational amplifiers used in the conversion system of FIG. 5 by a capacitance generally designated as 78 with a number of prime marks thereafter appropriate to the conversion system in which it is located.

This arrangement is especially useful for situations where the input analog signal sources are photodiodes with the output current for each in response to impinging photons to be converted to equivalent digital code representations. Such photodiodes also each provide what is known as a "dark current" which current portion is desired to be removed as it does not represent an impinging photon response signal component. By connecting a reference photodiode which is prevented from receiving light between the offset analog signals input and ground so that only a "dark current" flows therein, such a "dark current" value can be removed from all of the other signal photodiodes connected to the other analog signal inputs in the arrangement of FIG. 5.

The "dark current" of the reference photodiode connected to the offset input is integrated during the integration time and stored on capacitance 77, and is reflected in the voltage at output 73 of operational amplifier 70. This output voltage is coupled though the various conversion system capacitances having the numeral designator 78 to thereby provide a similar current to the inverting inputs of the operational amplifier in each of the conversion systems. This, in effect, provides a cancelation current to each conversion system to reduce the voltage being stored on the capacitor in each conversion system to thereby cancel the effect of the "dark currents" for the corresponding input photodiode if they are all well matched to the reference photodiode. If even greater precision is needed through cancelling the "dark current" of each input photodiode on an individual basis through closer matching thereof with a reference photodiode on a matched-pair basis, the added system associated with operational amplifier 70 must be repeated for each conversion system in the FIG. 5 system.

Although the present invention has been described with reference to preferred embodiments, workers skilled in the art will recognize that changes may be made in form and detail without departing from the spirit and scope of the invention.

What is claimed is:

1. An analog-to-digital converter system switchable between operating modes during a conversion, said conversion system having a first signal input region for receiving a first analog signal, and having a first plurality of signal output regions each for providing a digit signal of a selected value to thereby provide a first plurality of digit signals to represent selected values of a selected version of said first analog signal, said converter system comprising:

a first signal amplifier having an inverting input region which exhibits a relatively high circuit impedance, and having an output region which exhibits a relatively low circuit impedance, said first signal amplifier being capable of providing at said output region thereof a signal in a first magnitude direction substantially similar to a signal provided at said inverting input region thereof in a second magnitude direction but of a greater magnitude in said first magnitude direction;

first, second and third switching means each having first and second terminating regions and having a control region by which it is capable of being directed to provide a conductive path between its first and second terminating regions, said first switching means first terminating region being electrically connected to said converter system first signal input region and said first switching means second terminating region being electrically connected to said first signal amplifier inverting input region;

a first electrical energy storage means having first and second terminating regions and being capable of storing electrical energy therebetween, said first electrical energy storage means first terminal region being electrically connected to said first signal amplifier inverting input region, said second switching means first terminating region being electrically connected to said first electrical energy storage means second terminal region, and said second switching means second terminating region being electrically connected to said first signal amplifier output region;

a controlled reference signal generator having a plurality of control signal input regions and having an output region, said controlled reference signal generator being capable of providing reference signals of different values on said controlled reference signal generator output region in response to different combinations of values of input signals being provided on said controlled reference signal generator plurality of control signal input regions, said third switching means first terminating region being electrically connected to said first electrical energy storage means second terminal region, and said third switching means second terminating region being electrically connected to said controlled reference signal generator output region; and a multiple signal generator having a plurality of output regions at which output signals of different combinations of signal values can be provided, said multiple signal generator plurality of output regions having signals occurring thereat being electrically transferable to said controlled reference voltage generator plurality of control signal input regions and further being electrically transferable to said converter system first plurality of signal output regions.

2. The apparatus of claim 1 which further comprises a fourth switching means having first and second terminating regions and having a control region by which it is capable of being directed to provide a conductive path between its first and second terminating regions, said fourth switching means first terminating region being electrically connected to said first signal amplifier inverting input region and said fourth switching means second terminating region being electrically connected to said first signal amplifier output region.

3. The apparatus of claim 1 wherein said first signal amplifier has a non-inverting input region which exhibits a relatively high circuit impedance and with said first signal amplifier being capable of providing at said output region thereof a signal in a first magnitude direction substantially similar to a signal provided at said non-inverting input region thereof in said first magnitude direction but of a greater magnitude in said first magnitude in said first magnitude direction, and which further comprises a fourth switching means having first and second terminating regions and having a control region by which it is capable of being directed to provide a conductive path between its first and second terminating regions, said fourth switching means first terminating region being electrically connected to said converter system first signal input region and said fourth switching means second terminating region being electrically connected to said first signal amplifier non-inverting input region and to a first terminal means adapted for connection to a first voltage source.

4. The apparatus of claim 1 wherein said controlled reference signal generator is a digital-to-analog converter.

5. The apparatus of claim 1 wherein said controlled reference signal generator is a switched capacitor circuit.

6. The apparatus of claim 1 wherein said multiple signal generator is formed by a counter circuit capable of providing different combinations of signal values at said multiple signal generator plurality of output regions with each such combination representing a count reached in said counter circuit.

7. The apparatus of claim 1 wherein output signals at said multiple signal generator plurality of output regions are electrically transferable to said converter system first plurality of signal output regions by a memory means having a plurality of memory means input regions electrically connected to said multiple signal generator plurality of output regions and a plurality of memory means output regions electrically connected to said converter system first plurality of signal output regions, and further having a memory means write input region by which said memory means is capable of being directed to accept and store a signal combination provided on said memory means plurality of input regions and of presenting this combination at said memory means plurality of output regions, said first signal amplifier output region having signals occurring thereat being electrically transferable to said memory means write input region.

8. The apparatus of claim 1 wherein said first electrical energy storage means is a capacitive means.

9. The apparatus of claim 1 wherein said converter system has a second signal input region for receiving a second analog signal and further comprises:
 a second signal amplifier having an inverting second input region which exhibits a relatively high circuit impedance, and having an output region which exhibits a relatively low circuit impedance, said second signal amplifier being capable of providing at said output region thereof a signal in a first magnitude direction substantially similar to a signal provided at said inverting input region thereof in a second magnitude direction but of a greater magnitude in said first magnitude direction;
 fourth, fifth and sixth switching means each having first and second terminating regions and having a control region by which it is capable of being directed to provide a conductive path between its first and second terminating regions, said fourth switching means first terminating region being electrically connected to said converter system second signal input region and said fourth switching means second terminating region being electrically connected to said second signal amplifier inverting input region;
 a second electrical energy storage means having first and second terminal regions and being capable of storing electrical energy therebetween, said second electrical energy storage means first terminating region being electrically connected to said second signal amplifier inverting input region, said fifth switching means first terminating region being electrically connected to said second electrical energy storage means second terminal region, and said fifth switching means second terminating region being electrically connected to said second signal amplifier output region; and
 said sixth switching means first terminating region being electrically connected to said second electrical energy storage means second terminal region, and said sixth switching means second terminal region being electrically connected to said controlled reference signal generator output.

10. The apparatus of claim 1 wherein said converter system is capable of cancelling a selected portion of said first analog signal through use of a cancellation signal which can be provided to said converter system at a cancellation input region thereof, said converter system further comprising:
 a cancellation signal amplifier having an inverting input region which exhibits a relatively high circuit impedance, and having an output region which exhibits a relatively low circuit impedance, said cancellation signal amplifier being capable of providing at said output region thereof a signal in a first magnitude direction substantially similar to a signal provided at said inverting input region thereof in a second magnitude direction but of a greater magnitude in said first magnitude direction;
 a fourth switching means having first and second terminating regions and having a controlled region by which it is capable of being directed to provide a conductive path between its first and second terminating regions, said fourth switching means first terminating region being electrically connected to said converter system cancellation input region and said fourth switching means second terminating region being electrically connected to said cancellation signal amplifier inverting input region;
 a plurality of cancellation capacitive means, including first and second cancellation capacitive means, each having first and second terminal regions, said first cancellation capacitive means first terminating region being electrically connected to said cancellation signal amplifier inverting input region, said second cancellation capacitive means first terminating region being electrically connected to said first signal amplifier inverting input region, said first and second cancellation capacitive means second terminating regions each being electrically connected to said cancellation signal amplifier output.

11. The apparatus of claim 2 wherein said first signal amplifier has a non-inverting input region which exhibits a relatively high circuit impedance and with said first signal amplifier being capable of providing at said output region thereof a signal in a first magnitude direction substantially similar to a signal provided at said non-inverting input region thereof in said first magnitude direction but of a greater magnitude in said first magnitude in said first magnitude direction, and which further comprises a fifth switching means having first and second terminating regions and having a control region by which it is capable of being directed to provide a conductive path between its first and second terminating regions, said fifth switching means first terminating region being electrically connected to said converter system first signal input region and said fifth switching means second terminating region being electrically connected to said first signal amplifier non-inverting input region and to a first terminal means adapted for connection to a first voltage source.

12. The apparatus of claim 5 wherein said switched capacitive circuit is a switched capacitor integrator.

13. The apparatus of claim 6 wherein said counter circuit is a binary counter circuit.

14. The apparatus of claim 7 wherein signals on said first signal amplifier output region are electrically transferable to said memory means write input region by a logic gate.

15. The apparatus of claim 9 wherein output signals at said multiple signal generator plurality of output regions are electrically transferable to said converter system first plurality of signal output regions by a first memory means having a plurality of first memory means input regions electrically connected to said multiple signal generator plurality of output regions and a plurality of first memory means output regions electrically connected to said converter system first plurality of signal output regions, and further having a first memory means write input region by which said first memory means is capable of being directed to accept and store a signal combination provided on said first memory means plurality of input regions and of presenting this combination at said first memory means plurality of output regions, said first signal amplifier output region having signals occurring thereat being electrically transferrable to said first memory means write input region, and wherein output signals at said multiple signal generator plurality of output regions are electrically transferable to said converter system first plurality of signal output regions by a second memory means having a plurality of second memory means input regions electrically connected to said multiple signal generator plurality of output regions and a plurality of second memory means output regions electrically connected to said converter system first plurality of signal output regions, and further having a second memory means write input region by which said second memory means is capable of being directed to accept and store a signal combination provided on said second memory means plurality of input regions and of presenting this combination at said second memory means plurality of output regions, said second signal amplifier output region having signals occurring thereat being electrically transferrable to said second memory means write input region.

16. The apparatus of claim 9 which further comprises a plurality of comparator means each having an input region including first and second comparator means, said comparator means input region being electrically connected to said first signal amplifier output region and said second comparator means input region being electrically connected to said second signal amplifier output region.

17. The apparatus of claim 9 which further comprises a signal averaging means having a plurality of input regions including first and second input regions, said averaging means first input region being electrically connected to said first signal amplifier output region and said averaging means second input region being electrically connected to said second signal amplifier output region.

18. The apparatus of claim 9 wherein said controlled reference signal generator is a digital-to-analog converter.

19. The apparatus of claim 9 wherein said controlled reference signal generator is a switched capacitor circuit.

20. The apparatus of claim 15 wherein said multiple signal generator is formed by a counter circuit capable of providing different combinations of signal values at said multiple signal generator plurality of output regions with each such combination representing a count reached in said counter circuit.

21. The apparatus of claim 9 wherein said first and second electrical energy storage means are capacitive means.

22. The apparatus of claim 10 wherein output signals at said multiple signal generator plurality of output regions are electrically transferable to said converter system first plurality of signal output regions by a memory means having a plurality of memory means input regions electrically connected to said multiple signal generator plurality of output regions and a plurality of memory means output regions electrically connected to said converter system first plurality of signal output regions, and further having a memory means write input region by which said memory means is capable of being directed to accept and store a signal combination provided on said memory means plurality of input regions and of presenting this combination at said memory means plurality of output regions, said first signal amplifier output region having signals occurring thereat being electrically transferable to said memory means write input region.

23. The apparatus of claim 10 wherein said controlled reference signal generator is a digital-to-analog converter.

24. The apparatus of claim 10 wherein said controlled reference signal generator is a switched capacitor circuit.

25. The apparatus of claim 10 wherein said multiple signal generator is formed by a counter circuit capable of providing different combinations of signal values at said multiple signal generator plurality of output regions with each such combination representing a count reached in said counter circuit.

26. The apparatus of claim 10 wherein said first electrical energy storage means is a capacitive means.

27. The apparatus of claim 13 wherein said counter circuit is a downward counting counter circuit.

28. The apparatus of claim 14 wherein said logic gate is an AND gate.

29. The apparatus of claim 15 wherein signals on said first signal amplifier output region are electrically transferable to said first memory means write input region by a first logic gate electrically connected at an output region thereof to an input region of a first resettable single pulse generator, and wherein signals on said second signal amplifier output region are electrically transferable to said second memory means write input region by a second logic gate electrically connected at an output region thereof to an input region of a second resettable single pulse generator.

30. The apparatus of claim 19 wherein said switched capacitive circuit is a switched capacitor integrator.

31. The apparatus of claim 20 wherein said counter circuit is a binary counter circuit.

32. The apparatus of claim 22 wherein signals on said first signal amplifier output region are electrically transferable to said memory means write input region by a logic gate electrically connected at an output thereof to an input of a resettable single pulse generator.

33. The apparatus of claim 24 wherein said switched capacitive circuit is a switched capacitor integrator.

34. The apparatus of claim 25 wherein said counter circuit is a binary counter circuit.

35. The apparatus of claim 31 wherein said counter circuit is a downward counting counter circuit.

36. The apparatus of claim 34 wherein said counter circuit is a downward counting counter circuit.

* * * * *